(12) United States Patent
Lin

(10) Patent No.: US 7,863,706 B2
(45) Date of Patent: Jan. 4, 2011

(54) CIRCUIT SYSTEM WITH CIRCUIT ELEMENT

(75) Inventor: Yaojian Lin, Singapore (SG)

(73) Assignee: Stats Chippac Ltd., Singapore (SG)

( * ) Notice: Subject to any disclaimer, the term of this patent is extended or adjusted under 35 U.S.C. 154(b) by 28 days.

(21) Appl. No.: 11/770,690

(22) Filed: Jun. 28, 2007

(65) Prior Publication Data

US 2009/0001509 A1 Jan. 1, 2009

(51) Int. Cl.
*H01L 29/00* (2006.01)

(52) U.S. Cl. ............... 257/528; 257/531; 257/533; 257/E27.024; 257/E27.025; 257/E27.07; 257/E27.071

(58) Field of Classification Search ......... 257/528, 257/E27.024, E27.025, E27.07, E27.071, 257/531, 533
See application file for complete search history.

(56) References Cited

U.S. PATENT DOCUMENTS

| | | | |
|---|---|---|---|
| 5,736,776 A * | 4/1998 | Yamamoto et al. ......... 257/532 |
| 6,207,522 B1 | 3/2001 | Hunt et al. | |
| 6,232,238 B1 | 5/2001 | Chang et al. | |
| 6,444,920 B1 * | 9/2002 | Klee et al. ............... 174/260 |
| 6,518,642 B2 | 2/2003 | Kim et al. | |
| 6,674,131 B2 * | 1/2004 | Yokogawa et al. ......... 257/379 |
| 6,682,659 B1 | 1/2004 | Cho et al. | |
| 6,777,776 B2 * | 8/2004 | Hieda ..................... 257/532 |
| 6,800,920 B2 * | 10/2004 | Nishijima ................ 257/531 |
| 6,876,056 B2 * | 4/2005 | Tilmans et al. ............ 257/528 |
| 7,105,379 B2 | 9/2006 | Tsao et al. | |
| 2002/0036334 A1 * | 3/2002 | Van Den Broek et al. ... 257/528 |
| 2003/0219956 A1 * | 11/2003 | Mori et al. ............... 438/393 |
| 2004/0080021 A1 * | 4/2004 | Casper et al. ............. 257/528 |
| 2005/0098851 A1 * | 5/2005 | Nakayama et al. ......... 257/528 |
| 2005/0218520 A1 * | 10/2005 | Kikuta et al. ............. 257/758 |
| 2006/0211212 A1 * | 9/2006 | Baniecki et al. .......... 438/396 |
| 2008/0048188 A1 * | 2/2008 | Pei ......................... 257/66 |

\* cited by examiner

*Primary Examiner*—Steven Loke
*Assistant Examiner*—Brandon Fox
(74) *Attorney, Agent, or Firm*—Mikio Ishimaru

(57) ABSTRACT

A circuit system includes: forming a first electrode over a substrate; applying a dielectric layer over the first electrode and the substrate; forming a second electrode over the dielectric layer; and forming a dielectric structure from the dielectric layer with the dielectric structure within a first horizontal boundary of the first electrode.

20 Claims, 6 Drawing Sheets

CIRCUIT SYSTEM WITH CIRCUIT ELEMENT

TECHNICAL FIELD

The present invention relates generally to a circuit system and more particularly to a circuit system with a circuit element.

BACKGROUND ART

Modern consumer electronics, such as smart phones, personal digital assistants, and location based services devices, as well as enterprise electronics, such as servers and storage arrays, are packing more integrated circuits into an ever-shrinking physical space with expectations for decreasing cost. Every new generation of integrated circuits with increased operating frequency, performance and the higher level of large-scale integration have underscored the need for back-end integrated circuit manufacturing to provide more solutions involving the integrated circuit itself.

Numerous technologies have been developed to meet these requirements. Some of the research and development strategies focus on new package technologies while others focus on improving the existing and mature package technologies. Both approaches may include additional processing of the integrated circuits to better match the targeted package.

The continued emphasis in the integrated circuit technology is to create improved performance integrated circuit devices at competitive prices. This emphasis over the years has resulted in increasing miniaturization of integrated circuit devices, made possible by continued advances of integrated circuit processes and materials in combination with new and sophisticated device designs.

Numerous integrated circuit designs are aimed for mixed-signal designs by incorporating analog functions. One of the major challenges in the creation of analog processing circuitry (using digital processing procedures and equipment) is that a number of the components that are used for analog circuitry are large in size and are therefore not readily integrated into integrated circuits. The main components that offer a challenge in this respect are capacitors and inductors, since both these components are, for typical analog processing circuits, of considerable size. In response to the demands for improved package performance and analog circuitry integration, manufacturers may prepare to add passive devices on integrated circuit, packaging as well as printed-circuit boards to reduce overall system cost, boost overall system performance and enhance overall system reliability.

Although analog circuitry integration and processing support the miniaturization trend, other problems arise from this integration, particularly, the reliability of passive devices. For example, passive devices can pre-maturely breakdown below the operating voltage to reduce its useful lifetime.

Still thinner, smaller, and lighter package designs and integrated circuit designs and printed circuit designs have been adopted in response to continuing requirements for further miniaturization. At the same time, users are demanding the entire system, including integrated circuit, packages, and printed circuit boards that are more reliable under increasingly severe operating conditions.

Thus, a need still remains for a circuit system providing low cost manufacturing, improved yield, improved reliability, and greater flexibility to add passive devices on integrated circuits, packages, and printed circuit boards. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a circuit system including: forming a first electrode over a substrate; applying a dielectric layer over the first electrode and the substrate; forming a second electrode over the dielectric layer; and forming a dielectric structure from the dielectric layer with the dielectric structure within a first horizontal boundary of the first electrode.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
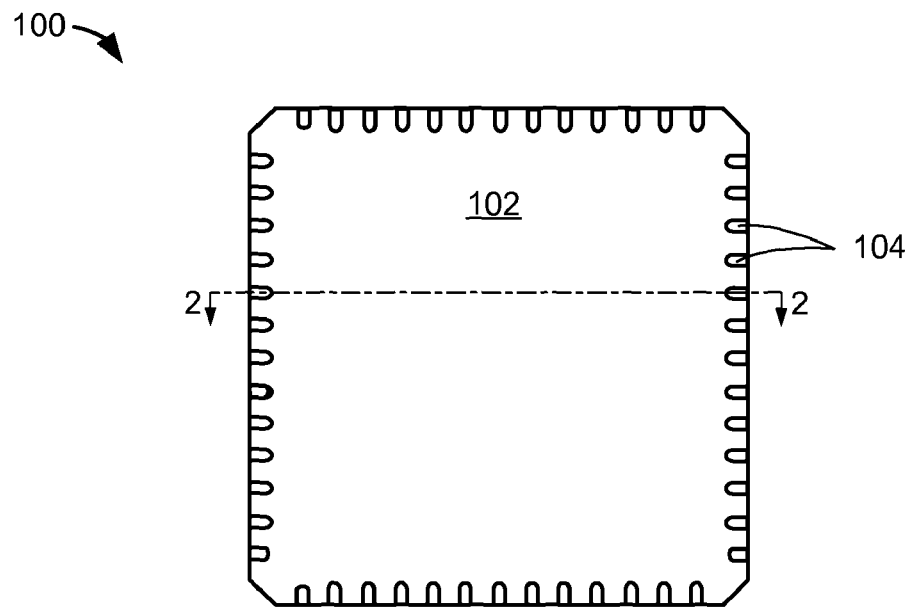
FIG. 1 is a bottom view of a circuit system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a bottom view of a circuit system 100 in a first embodiment of the present invention. The bottom view shows a package encapsulation 102, such as an epoxy molding compound, preferably surrounding and exposing a row of external interconnects 104, such as leads.

For illustrative purposes, the external interconnects 104 are shown in a single row configuration, although it is understood that the external interconnects 104 may be in a different configuration, such as multiple rows. Also for illustrative purposes, a package side of the circuit system 100 has the external interconnects 104 equally spaced, although it is understood that the circuit system 100 may have some sites depopulated such that the package side might not have the external interconnects 104 equally spaced.

Figure 2:
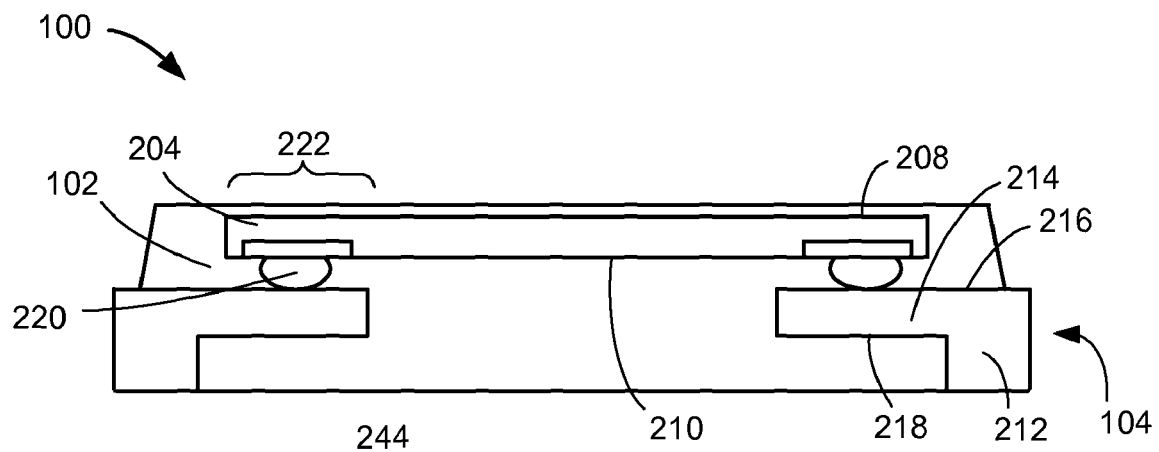
FIG. 2 is a cross-sectional view of the circuit system along line 2-2 of FIG. 1.

Referring now to FIG. 2, therein is shown a cross-sectional view of the circuit system 100 along a line 2-2 of FIG. 1. The cross-sectional view depicts a first circuit device structure 204 preferably mounted over the external interconnects 104. The first circuit device structure 204, such as an integrated circuit die, a printed circuit board, or a substrate, has a first non-electrical contact side 208, such as a non-active side, and a first electrical contact side 210, such as an active side, wherein the first electrical contact side 210 includes active circuitry and passive circuitry fabricated thereon. The first electrical contact side 210 is facing the external interconnects 104.

Each of the external interconnects 104 includes a body 212 and a tip 214, wherein the tip 214 has a first connect side 216 and a second connect side 218 on an opposing side to the first connect side 216. The first circuit device structure 204 is preferably mounted over the first connect side 216 with conductive balls 220, such as conductive balls or conductive bumps comprised of solder or gold, preferably electrically connecting a peripheral portion 222 of the first electrical contact side 210 of the first circuit device structure 204 to the first connect side 216.

The package encapsulation 102, such as an epoxy molding compound, covers the first circuit device structure 204 and the conductive balls 220. The package encapsulation 102 partially covers the external interconnects 104 exposing the body 212 of the external interconnects 104 and covering a portion of the tip 214 connected to the conductive balls 220.

Figure 3:
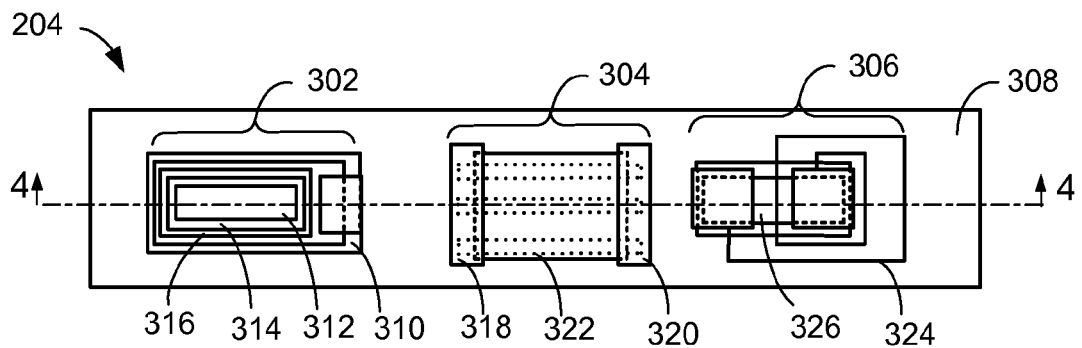
FIG. 3 is a schematic top view of a portion of the first electrical contact side of the circuit system.

Referring now to FIG. 3, therein is shown a schematic top view of a portion of the first electrical contact side 210 of the circuit system 100 of FIG. 1. The schematic top view depicts a first circuit element 302, a second circuit element 304, and a third circuit element 306 over a substrate 308 of the first circuit device structure 204, without all of the layers. The first circuit element 302 is shown as a capacitor, as an example. The second circuit element 304 is shown as a resistor, as an example. The third circuit element 306 is shown as an inductor, as an example.

The first circuit element 302 preferably includes a first electrode 310 and a second electrode 312 over the substrate 308. In between the first electrode 310 and the second electrode 312 are preferably a first dielectric structure 314 over a first resistive film 316. The second electrode 312 is preferably over the first dielectric structure 314. The first dielectric structure 314 preferably does not extend beyond the first resistive film 316 and the first electrode 310.

It has been discovered that the present invention that the first circuit element, such as a capacitor, having the horizontal dimensions within the horizontal boundary of the resistive film and the horizontal boundary of the first electrode improves the reliability of the circuit system. The horizontal dimensions of the dielectric medium relative to the resistive film and the first electrode improves breakdown voltage and improves uniformity of capacitance. The structural relationship of the dielectric medium to other portions of the first circuit element eliminates ion milling the dielectric medium for forming the first circuit element eliminating potential damage to the dielectric medium from ion milling. In addition, the dielectric medium may be formed without damaging the first electrode.

The material of the first electrode 310 and the second electrode 312 can be formed from a number of conductive materials. For example, the first electrode 310 and the second electrode 312 may be formed from aluminum (Al). Al alloy, copper (Cu), gold (Au), or with other metals or metal alloys. For illustrative purposes, the first electrode 310 and the second electrode 312 are described potentially formed from substantially the same material, although it is understood that the first electrode 310 and the second electrode 312 may be formed with a different material or materials.

The first resistive film 316 may be formed from a number of different materials. For example, the first resistive film 316 can be formed from tantalum (Ta) silicide, nickel chromium (NiCr), tantalum nitride (TaN), titanium nitride (TiN), or other high resistive metals or metal alloys.

The first dielectric structure 314 may be formed from a number of different materials. For example, the first dielectric structure 314 may be a dielectric material including silicon nitride ($Si_3N_4$), silicon oxynitride (SiON), tantalum oxide, or other dielectric materials. As another example, the first dielectric structure 314 may be formed with multilayer dielectric structures, such as a dielectric bi-layer of silicon oxide and silicon nitride ($SiO_2/Si_3N_4$).

The second circuit element 304 preferably includes a first resistor interconnect 318 and a second resistor interconnect 320 over the substrate 308. Between the two resistor contacts is preferably a resistor body 322, as depicted by the dotted line.

The first resistor interconnect 318 and the second resistor interconnect 320 may be formed from a number of materials. For example, the first resistor interconnect 318 and the second resistor interconnect 320 may be formed from conductive materials including Al. Al alloy, Cu, Au, or other metals or metal alloys. For illustrative purposes, the first resistor interconnect 318 and the second resistor interconnect 320 are described potentially formed from substantially the same material, although it is understood that the first resistor interconnect 318 and the second resistor interconnect 320 may be formed with a different material or materials.

The resistor body 322 may be formed from a number of different materials. For example, the resistor body 322 may be formed from resistive materials including Ta silicide, NiCr, TaN, TiN, or other high resistive metals or metal alloys. As a more specific example, the resistor body 322 may be formed with the same material layer for forming the first resistive film 316. For illustrative purposes, the resistor body 322 and the first resistive film 316 are described potentially formed from substantially the same material, although it is understood that the resistor body 322 and the first resistive film 316 may be formed with a different material or materials.

The third circuit element 306 preferably includes an inductor body 324 and an inductor bridge 326 over the substrate 308. The inductor bridge 326 preferably connects the inductor body 324.

The inductor body 324 and the inductor bridge 326 may be formed from a number of different materials. For example, the inductor body 324 and the inductor bridge 326 may be formed from materials, including Al. Al alloy, Cu, Au, or other metals or metal alloys. As a more specific example, the inductor bridge 326 may be formed with the same material layer for forming the first electrode 310 and the inductor body 324 may be formed with the same material layer for forming the second electrode 312. For illustrative purposes, the inductor body 324 and the inductor bridge 326 are described potentially formed from substantially the same material, although it is understood that the inductor body 324 and the inductor bridge 326 may be formed with a different material or materials.

For illustrative purposes, the substrate 308 is described as an integrated circuit substrate, although it is understood that the substrate 308 may not be an integrated circuit substrate. For example, the substrate 308 may be a substrate of an integrated circuit package or a printed circuit board.

Figure 4:
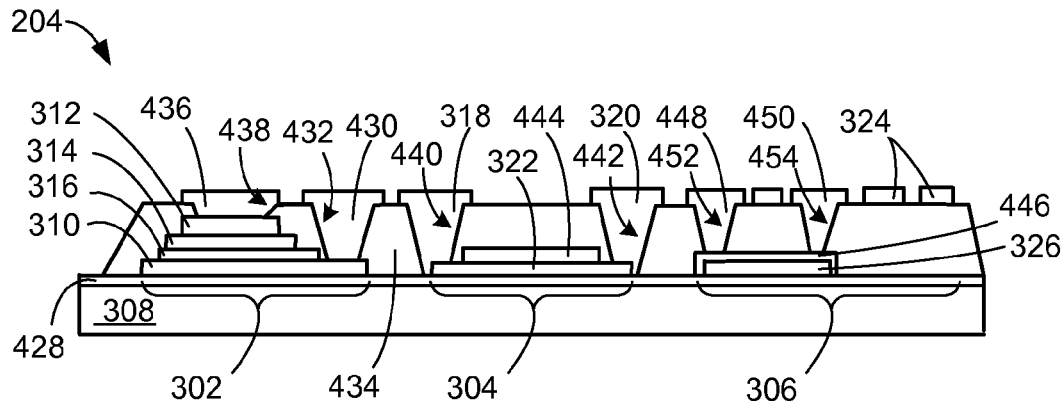
FIG. 4 is a cross-sectional view of the structure of FIG. 3 along line 4-4 of FIG. 3.

Referring now to FIG. 4, therein is shown a cross-sectional view of the structure of FIG. 3 along line 4-4 of FIG. 3. The cross-sectional view depicts the first circuit element 302, the second circuit element 304, and the third circuit element 306 over a first insulating film 428, wherein the first insulating film 428 is formed directly on the substrate 308 to entirely cover the substrate 308. The first electrode 310 may be formed over the first insulating film 428. As described above, the first circuit element 302 is preferably a capacitor, the second circuit element 304 is preferably a resistor, and the third circuit element 306 is preferably an inductor.

The material of the first insulating film 428 may be formed from a number of different materials. For example, the first insulating film 428 may be an insulating material including $SiO2$.

The first circuit element 302 preferably includes the first electrode 310 over the first insulating film 428. The first resistive film 316 is preferably over and within the horizontal boundary of the first electrode 310. The first dielectric structure 314 is preferably over and within the horizontal boundary of the first resistive film 316. The second electrode 312 is preferably over the first dielectric structure 314. The first electrode 310 is preferably connected to a first capacitor interconnect 430 through a first opening 432 of a second insulating film 434. The second electrode 312 is preferably connected to a second capacitor interconnect 436 through a second opening 438 of the second insulating film 434.

The material of the first capacitor interconnect 430 and the second capacitor interconnect 436 can be formed from a number of conductive materials. For example, the first capacitor interconnect 430 and the second capacitor interconnect 436 may be formed from aluminum (Al). Al alloy, copper (Cu), gold (Au), or with other metals or metal alloys. For illustrative purposes, the first capacitor interconnect 430 and the second capacitor interconnect 436 are described potentially formed from substantially the same material, although it is understood that the first capacitor interconnect 430 and the second capacitor interconnect 436 may be formed with a different material or materials.

The material of the second insulating film 434 may be formed from a number of different materials. For example, the second insulating film 434 may be an insulating material including polyimide, benzocyclobutene (BCB), or polybenzoxazole (PBO).

The second circuit element 304 preferably includes the resistor body 322 over the first insulating film 428. The first resistor interconnect 318 and the second resistor interconnect 320 preferably connect to the resistor body 322 through a third opening 440 and a fourth opening 442 in the second insulating film 434, respectively. Between the two resistor contacts is the resistor body 322, which is below a second dielectric structure 444. The second dielectric structure 444 is preferably within the horizontal boundary of the resistor body 322 and covered by the second insulating film 434.

The first resistor interconnect 318 and the second resistor interconnect 320 may be formed from a number of materials. For example, the first resistor interconnect 318 and the second resistor interconnect 320 may be formed from conductive materials including Al. Al alloy, Cu, Au, or other metals or metal alloys. As a more specific example, the first resistor interconnect 318 and the second resistor interconnect 320 may be formed with the same material layer for forming the first capacitor interconnect 430 and the second capacitor interconnect 436. For illustrative purposes, the first resistor interconnect 318 and the second resistor interconnect 320 are described potentially formed from substantially the same material, although it is understood that the first resistor interconnect 318 and the second resistor interconnect 320 may be formed with a different material or materials.

The third circuit element 306 preferably includes the inductor bridge 326 over the first insulating film 428. The third circuit element 306 also preferably includes a third resistive film 446 covering the inductor bridge 326 includes sides of the inductor bridge 326. The "third" in the third resistive film 446 is used as a matter of convenience to have a similar name to the third circuit element 306 and does not necessarily represent the third resistive film 446 in a sequence of resistive films discussed. The third resistive film 446 may be formed form a number of materials. For example, the third resistive film 446 may be formed with the same material or layer as the first resistive film 316 and the resistor body 322.

Above the third resistive film 446 is preferably the second insulating film 434. The inductor body 324 is preferably over the second insulating film 434. A first inductor interconnect 448 and a second inductor interconnect 450 preferably connect the inductor bridge 326 through a fifth opening 452 and a sixth opening 454, respectively, in the second insulating film 434.

The material of the first inductor interconnect 448 and the second inductor interconnect 450 can be formed from a number of conductive materials. For example, the first inductor interconnect 448 and the second inductor interconnect 450 may be formed from aluminum (Al). Al alloy, copper (Cu), gold (Au), or with other metals or metal alloys. As a more specific example, the first inductor interconnect 448 and the second inductor interconnect 450 may formed with the same material layer for forming the first capacitor interconnect 430 and the second capacitor interconnect 436. For illustrative purposes, the first inductor interconnect 448 and the second inductor interconnect 450 are described potentially formed from substantially the same material, although it is understood that the first inductor interconnect 448 and the second inductor interconnect 450 may be formed with a different material or materials.

For illustrative purposes, the third circuit element 306 depicts the third resistive film 446 covering the inductor bridge 326, although it is understood that the third resistive film 446 is optional. Also for illustrative purposes, the third resistive film 446 and the first resistive film 316 are described potentially formed from substantially the same material, although it is understood that the third resistive film 446 and the first resistive film 316 may be formed with a different material or materials.

Figure 5:
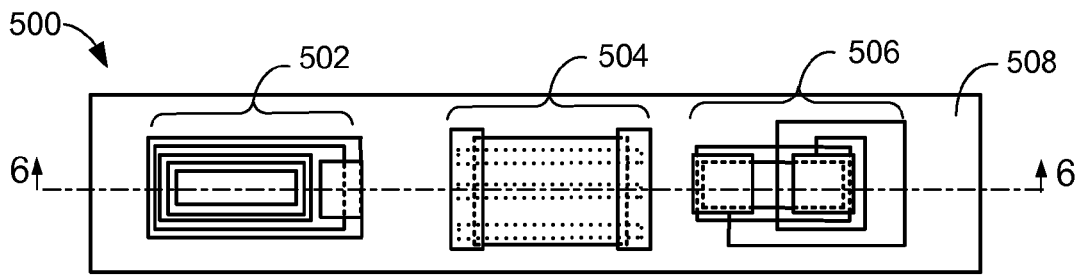
FIG. 5 is a schematic top view of a portion of a first electrical contact side of the circuit system in a second embodiment of the present invention.

Referring now to FIG. 5, therein is shown a schematic top view of a portion of a first electrical contact side of a circuit system 500 in a second embodiment of the present invention. The circuit system 500 have similarities to the circuit system 100 of FIG. 3 with materials for the elements from the circuit system 100 may be preferably applicable to the elements having the same name in the circuit system 500, unless otherwise noted. The circuit system 500 includes a first circuit element 502, a second circuit element 504 and a third circuit element 506 over a substrate 508, such as an integrated circuit die, a wafer, or a printed circuit board.

Figure 6:
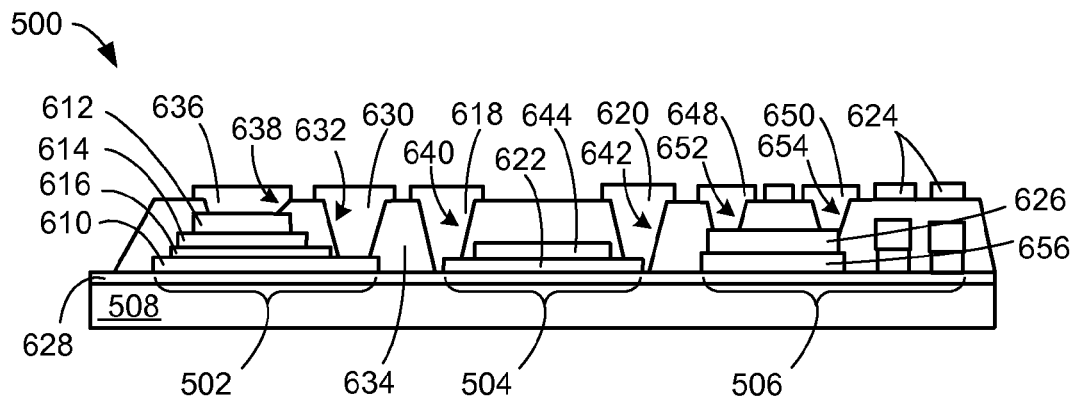
FIG. 6 is a cross-sectional view of a portion of the first electrical contact side of the circuit system along line 6-6 of FIG. 5.

Referring now to FIG. 6, therein is shown cross-sectional view of a portion of the first electrical contact side of the circuit system 500 along line 6-6 of FIG. 5. The cross-sectional view depicts the first circuit element 502, the second circuit element 504, and the third circuit element 506 over the substrate 508. The first circuit element 502 is shown as a capacitor, as an example. The second circuit element 504 is shown as a resistor, as an example. The third circuit element 506 is shown as an inductor, as an example.

The first circuit element 502 preferably includes a first electrode 610 and a second electrode 612 over a first insulating film 628, wherein the first insulating film 628 is preferably over the substrate 508. In between the first electrode 610 and the second electrode 612 are preferably a first dielectric structure 614 and a first resistive film 616. The first resistive film 616 is preferably over and within the horizontal boundary of the first electrode 610. The first dielectric structure 614 is preferably over and within the horizontal boundary of the first resistive film 616. The second electrode 612 is preferably over the first dielectric structure 614. The first electrode 610 is preferably connected to a first capacitor interconnect 630 through a first opening 632 of a second insulating film 634. The second electrode 612 is preferably connected to a second capacitor interconnect 636 through a second opening 638 of the second insulating film 634.

The second circuit element 504 preferably includes a resistor body 622 as depicted by the dotted line, over the first insulating film 628. A first resistor interconnect 618 and a second resistor interconnect 620 preferably connect to the resistor body 622 through a third opening 640 and a fourth opening 642 in the second insulating film 634, respectively. Between the two resistor contacts is the resistor body 622, which is below a second dielectric structure 644. The second dielectric structure 644 is preferably within the horizontal boundary of the resistor body 622 and covered by the second insulating film 634.

The third circuit element 506 preferably includes a third dielectric structure 656 over the first insulating film 628. An inductor bridge 626 is preferably over and within the horizontal boundary of the third dielectric structure 656. As a more specific example, the inductor bridge 626 is preferably on the third dielectric structure 656. Above the third dielectric structure 656 is preferably the second insulating film 634. An inductor body 624 is preferably over the second insulating film 634. As a more specific example, the inductor body 624 is preferably on the second insulating film 634. A first inductor interconnect 648 and a second inductor interconnect 650 preferably connect the inductor bridge 626 through a fifth opening 652 and a sixth opening 654, respectively, in the second insulating film 634.

The inductor bridge 626 may be formed from a number of materials. For example, the inductor bridge 626 may be formed from the materials or a material layer used to form the second electrode 612 of the first circuit element 502. The third dielectric structure 656 may be formed from a number of materials. For example, the third dielectric structure 656 may be formed from the materials or a material layer used to form the first dielectric structure 614 and the second dielectric structure 644.

Figure 7:
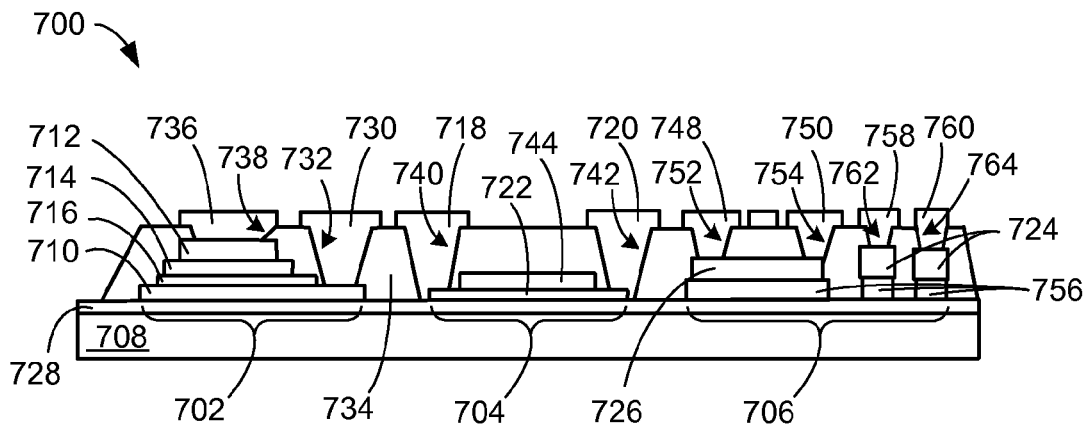
FIG. 7 is a cross-sectional view of a portion of a first electrical contact side of a circuit system as exemplified by the schematic top view of FIG. 5 along line 6-6 of FIG. 5 in a third embodiment of the present invention.

Referring now to FIG. 7, therein is shown cross-sectional view of a portion of a first electrical contact side of a circuit system 700 as exemplified by the schematic top view of FIG. 5 along line 6-6 of FIG. 5 in a third embodiment of the present invention. The circuit system 500 have similarities to the circuit system 500 of FIG. 5 with materials for the elements from the circuit system 500 may be preferably applicable to the elements having the same name in the circuit system 700, unless otherwise noted.

The cross-sectional view depicts a first circuit element 702, a second circuit element 704, and a third circuit element 706 over a substrate 708. The first circuit element 702 is shown as a capacitor, as an example. The second circuit element 704 is shown as a resistor, as an example. The third circuit element 706 is shown as an inductor, as an example.

The first circuit element 702 preferably includes a first electrode 710 and a second electrode 712 over a first insulating film 728, wherein the first insulating film 728 is preferably over the substrate 708. In between the first electrode 710 and the second electrode 712 are preferably a first dielectric structure 714 and a first resistive film 716. The first resistive film 716 is preferably over and within the horizontal boundary of the first electrode 710. The first dielectric structure 714 is preferably over and within the horizontal boundary of the first resistive film 716. The second electrode 712 is preferably over the first dielectric structure 714. The first electrode 710 is preferably connected to a first capacitor interconnect 730 through a first opening 732 of a second insulating film 734. The second electrode 712 is preferably connected to a second capacitor interconnect 736 through a second opening 738 of the second insulating film 734.

The second circuit element 704 preferably includes a resistor body 722 over the first insulating film 728. A first resistor interconnect 718 and a second resistor interconnect 720 preferably connect to the resistor body 722 through a third opening 740 and a fourth opening 742 in the second insulating film 734, respectively. Between the two resistor contacts is the resistor body 722, which is below a second dielectric structure 744. The second dielectric structure 744 is preferably within the horizontal boundary of the resistor body 722 and covered by the second insulating film 734.

The third circuit element 706 preferably includes a third dielectric structure 756 over the first insulating film 728. An inductor bridge 726 is preferably over and within the horizontal boundary of a portion of the third dielectric structure 756. As a more specific example, the inductor bridge 726 is preferably on a portion of the third dielectric structure 756. Above the inductor bridge 726 is preferably the second insulating film 734. A first inductor interconnect 748 and a second inductor interconnect 750 preferably connect the inductor bridge 726 through a fifth opening 752 and a sixth opening 754, respectively, in the second insulating film 734.

An inductor body 724 is preferably over a portion of the third dielectric structure 756 that is not under the inductor bridge 726. As a more specific example, the inductor body 724 is preferably on a portion of the third dielectric structure 756. A third inductor interconnect 758 and a fourth inductor interconnect 760 preferably connect with the inductor body 724 through a seventh opening 762 and an eighth opening 764, respectively, in the second insulating film 734. The third inductor interconnect 578 and the fourth inductor interconnect 760 may preferably provide additional conductive material volume for forming the inductor body 724. More generally, the third inductor interconnect 578 and the fourth inductor interconnect 760 connected with the inductor body 724 preferably increases the inductance value the third circuit element 706.

The inductor bridge 726 and the inductor body 724 may be formed from a number of materials. For example, the inductor bridge 726 may be formed from the materials or a material layer used to form the second electrode 712 of the first circuit element 702. The third dielectric structure 756 may be formed from a number of materials. For example, the third dielectric structure 756 may be formed from the materials or a material layer used to form the first dielectric structure 714 and the second dielectric structure 744.

Figure 8:
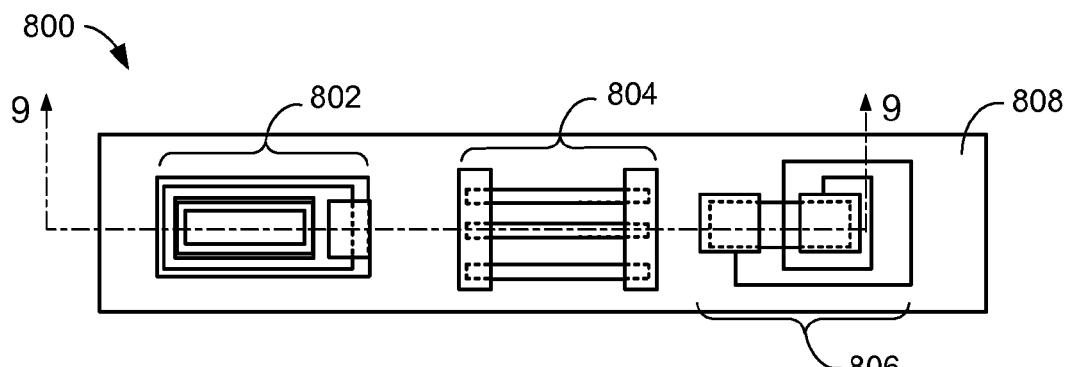
FIG. 8 is a schematic top view of a portion of a first electrical contact side of the circuit system in a fourth embodiment of the present invention.

Referring now to FIG. 8, therein is shown a schematic top view of a portion of a first electrical contact side of a circuit system 800 in a fourth embodiment of the present invention. The circuit system 800 have similarities to the circuit system 100 of FIG. 3 with materials for the elements from the circuit system 100 may be preferably applicable to the elements having the same name in the circuit system 800, unless otherwise noted. The circuit system 800 includes a first circuit element 802, a second circuit element 804 and a third circuit element 806 over a substrate 808, such as an integrated circuit die, a wafer, or a printed circuit board.

Figure 9:
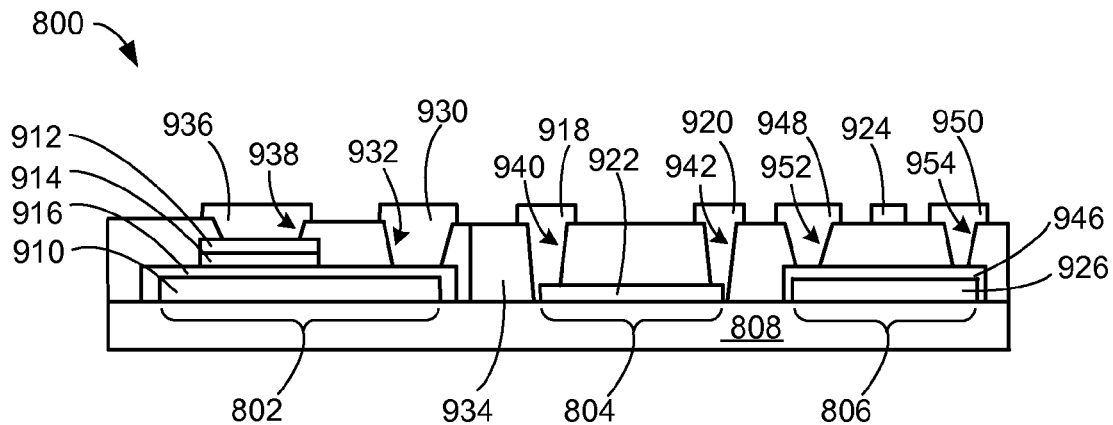
FIG. 9 is a cross-sectional view of a portion of the first electrical contact side of a circuit system along line 9-9 of FIG. 8.

Referring now to FIG. 9, therein is shown cross-sectional view of a portion of the first electrical contact side of the circuit system 800 along line 9-9 of FIG. 8. The circuit system 800 have similarities to the circuit system 100 of FIG. 3 with materials for the elements from the circuit system 100 may be preferably applicable to the elements having the same name in the circuit system 800, unless otherwise noted.

The cross-sectional view depicts the first circuit element 802, the second circuit element 804, and the third circuit element 806 over the substrate 808. The first circuit element 802 is shown as a capacitor, as an example. The second circuit element 804 is shown as a resistor, as an example. The third circuit element 806 is shown as an inductor, as an example.

The first circuit element 802 preferably includes a first electrode 910 and a second electrode 912 over the substrate 808. In between the first electrode 910 and the second electrode 912 are preferably a first dielectric structure 914 and a first resistive film 916. The first resistive film 916 is preferably over and surrounds the first electrode 910. The first dielectric structure 914 is preferably over and within the horizontal boundary of the first resistive film 916. The first resistive film 916 preferably extends beyond the horizontal boundary of the first electrode 910 to protect first electrode 910 from subsequent etching process, such as the etching process for forming the second electrode 912. The second electrode 912 is preferably over the first dielectric structure 914.

The cross-sectional view depicts the second electrode 912 having substantially the same horizontal dimension as the first dielectric structure 914. This structural relationship may be formed in a number of ways. For example, the second electrode 912 may be used as a mask instead of a photoresist mask (not shown) as the first dielectric structure 914 is formed through etching.

The layer forming the second electrode 912 preferably undergoes double etching with one lithography. Over etching is preferably controlled about 10 to 25% for the first etching, the wafer (not shown) having the substrate 808 undergoes hard bake for reestablishing photoresist adhesion, and dry etching preferably forms the first dielectric structure 914. The material layer (not shown) of the second electrode 912 undergoes a re-etch with an additional 15 to 50% over-etch time for avoiding an undercut of the first dielectric structure 914 under the second electrode 912.

The first electrode 910 is preferably connected to a first capacitor interconnect 930 through a first opening 932 of a second insulating film 934. The second electrode 912 is preferably connected to a second capacitor interconnect 936 through a second opening 938 of the second insulating film 934. The "second" in the second insulating film 934 is used for convenience for relative positional similarities with the other embodiments and is not intended to refer to the second instance of an insulating film discussed in this embodiment.

The second circuit element 804 preferably includes a resistor body 922 over the substrate 808. A first resistor interconnect 918 and a second resistor interconnect 920 preferably connect to the resistor body 922 through a third opening 940 and a fourth opening 942 in the second insulating film 934, respectively.

The third circuit element 806 preferably includes an inductor bridge 926 over the substrate 808. Above the inductor bridge 926 is preferably a third resistive film 946, wherein the third resistive film 946 is preferably under the second insulating film 934. The "third" in the third resistive film 946 is used as a matter of convenience to have a similar name to the third circuit element 806 and does not necessarily represent the third resistive film 946 in a sequence of resistive films discussed. The third resistive film 946 preferably extends beyond the horizontal boundary of the inductor bridge 926 to protect the inductor bridge 926 during subsequent etching process of the inductor body 924. An inductor body 924 is preferably over the second insulating film 934. A first inductor interconnect 948 and a second inductor interconnect 950 preferably connect the inductor bridge 926 through a fifth opening 952 and a sixth opening 954, respectively, in the second insulating film 934.

The inductor bridge 926 may be formed from a number of materials. For example, the inductor bridge 926 may be formed from the materials or a material layer used to form the first electrode 910 of the first circuit element 802.

The first resistive film 916, the resistor body 922, and the third resistive film 946 may be formed from a number of materials. For example, the first resistive film 916, the resistor body 922, and the third resistive film 946 may be formed from substantially the materials or a material layer.

Figure 10:
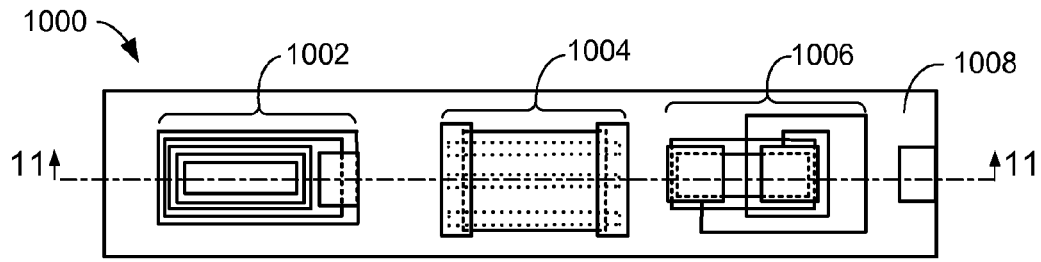
FIG. 10 is a schematic top view of a portion of a first electrical contact side of the circuit system in a fifth embodiment of the present invention.

Referring now to FIG. 10, therein is shown a schematic top view of a portion of a first electrical contact side of a circuit system 1000 in a fifth embodiment of the present invention. The circuit system 100 have similarities to the circuit system 100 of FIG. 3 with materials for the elements from the circuit system 100 may be preferably applicable to the elements having the same name in the circuit system 100, unless otherwise noted. The circuit system 100 includes a first circuit element 1002, a second circuit element 1004 and a third circuit element 1006 over a substrate 1008, such as an integrated circuit die, a wafer, or a printed circuit board.

Figure 11:
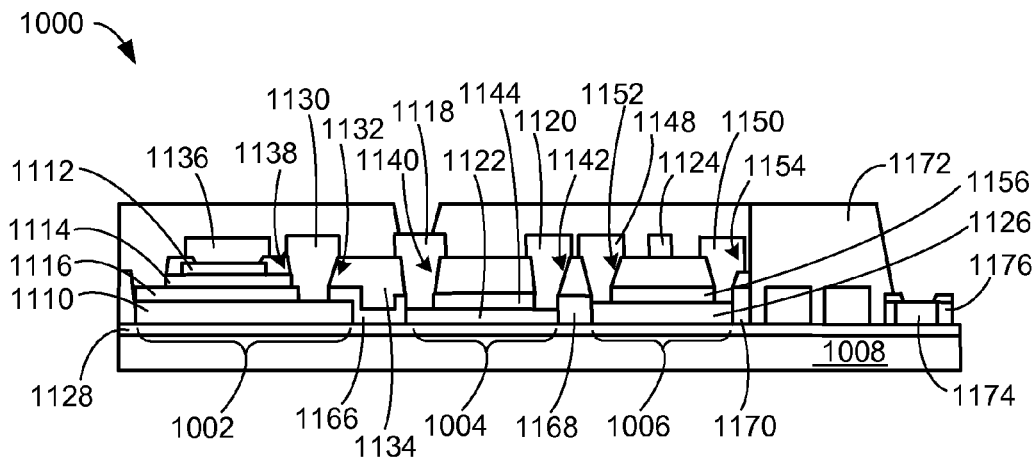
FIG. 11 is a cross-sectional view of a portion of the first electrical contact side of a circuit system along line 11-11 of FIG. 10.

Referring now to FIG. 11, therein is shown a cross-sectional view of a portion of the first electrical contact side of the circuit system 1000 along line 11-11 of FIG. 10. The circuit system 1000 have similarities to the circuit system 100 of FIG. 3 with materials for the elements from the circuit system 100 may be preferably applicable to the elements having the same name in the circuit system 1000, unless otherwise noted.

The cross-sectional view depicts the first circuit element 1002, the second circuit element 1004, and the third circuit element 1006 over the substrate 1008. The first circuit element 1002 is shown as a capacitor, as an example. The second circuit element 1004 is shown as a resistor, as an example. The third circuit element 1006 is shown as an inductor, as an example.

The first circuit element 1002 preferably includes a first electrode 1110 and a second electrode 1112 over a first insulating film 1128, wherein the first insulating film 1128 is preferably over the substrate 1008. In between the first electrode 1110 and the second electrode 1112 are preferably a first dielectric structure 1114 and a first resistive film 1116. The first resistive film 1116 is preferably over and within the horizontal boundary of the first electrode 1110.

The first dielectric structure 1114 is preferably over and within the horizontal boundary of the first resistive film 1116. The second electrode 1112 is preferably over the first dielectric structure 1114. The first electrode 1110 is preferably connected to a first capacitor interconnect 1130 through a first opening 1132 of a second insulating film 1134. The second electrode 1112 is preferably connected to a second capacitor interconnect 1136 through a second opening 1138 of the second insulating film 1134. The second insulating film 1134 may be preferably used as a mask for forming the first dielectric structure 1114.

The second circuit element 1004 preferably includes a resistor body 1122 over the first insulating film 1128. A first resistor interconnect 1118 and a second resistor interconnect 1120 preferably connect to the resistor body 1122 through a third opening 1140 and a fourth opening 1142 in the second insulating film 1134, respectively. Between the two resistor contacts is the resistor body 1122, which is below a second dielectric structure 1144. The second dielectric structure 1144 is preferably within the horizontal boundary of the resistor body 1122.

A first inter-element dielectric structure 1166 is preferably over the first insulating film 1128, over a portion of the first electrode 1110 to the first opening 1132, and adjacent to the resistor body 1122 and the third opening 1140. Similarly, the second dielectric structure 1144 and the first inter-element dielectric structure 1166 may be preferably formed in the etching process utilizing the second insulating film 1134 as a mask.

The third circuit element 1006 preferably includes an inductor bridge 1126 over the first insulating film 1128. A third dielectric structure 1156 is preferably over and within the horizontal boundary of the inductor bridge 1126. Above the third dielectric structure 1156 is preferably the second insulating film 1134. An inductor body 1124 is preferably over the second insulating film 1134. A first inductor interconnect 1148 and a second inductor interconnect 1150 preferably connect the inductor bridge 1126 through a fifth opening 1152 and a sixth opening 1154, respectively, in the second insulating film 1134.

A second inter-element dielectric structure 1168 is preferably over the first insulating film 1128 and adjacent to both the resistor body 1122 and the inductor bridge 1126. A third inter-element dielectric structure 1170 is adjacent to the inductor bridge 1126 at an opposing side with the second inter-element dielectric structure 1168. Similarly, the third dielectric structure 1156, the second inter-element dielectric structure 1168, and the third inter-element dielectric structure 1170 may be preferably formed in the etching process utilizing the second insulating film 1134 as a mask.

The inductor bridge 1126 may be formed from a number of materials. For example, the inductor bridge 1126 may be formed from the materials or a material layer used to form the first electrode 1110 of the first circuit element 1002. The third dielectric structure 1156, the first inter-element dielectric structure 1166, the second inter-element dielectric structure 1168, and the third inter-element dielectric structure 1170 may be formed from a number of materials. For example, the third dielectric structure 1156, the first inter-element dielectric structure 1166, the second inter-element dielectric structure 1168, and the third inter-element dielectric structure 1170 may be formed from the materials or a material layer used to form the first dielectric structure 1114 and the second dielectric structure 1144.

A passivation film 1172 preferably covers the first circuit element 1002, the second circuit element 1004, the third circuit element 1006, and the second insulating film 1134. The passivation film 1172 preferably includes the sixth opening 1154 exposing the first resistor interconnect 1118 for further processing. For illustration purposes, the sixth opening 1154 is shown exposing the first resistor interconnect 1118, although it is understood that the passivation film 1172 may have other openings at other locations.

The passivation film 1172 preferably exposes an external contact 1174 not part of the first circuit element 1002, the second circuit element 1004, or the third circuit element 1006. The external contact 1174 has sidewall dielectric structures 1176 adjacent to the sides of the external contact 1174. Similarly, the sidewall dielectric structures 1176 may be preferably formed in the etching process utilizing the second insulating film 1134 as a mask. The external contact 1174 may be formed form a number of materials. For example, the external contact 1174 may be formed from the materials used to form the first electrode 1110 and the inductor bridge 1126.

Figure 12:
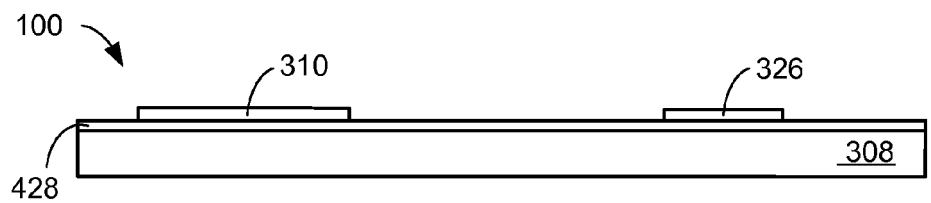
FIG. 12 is a cross-sectional view of a circuit system of FIG. 4 in a forming phase of the first electrode and the inductor bridge.

Referring now to FIG. 12, therein is a cross-sectional view of the circuit system 100 of FIG. 4 in a forming phase of the first electrode 310 and the inductor bridge 326. A first conductive material layer (not shown) is preferably deposited over the first insulating film 428, wherein the first insulating film 428 is preferably over the substrate 308. This first conductive material layer is preferably patterned, such as mask and etching, forming the first electrode 310 and the inductor bridge 326.

Figure 13:
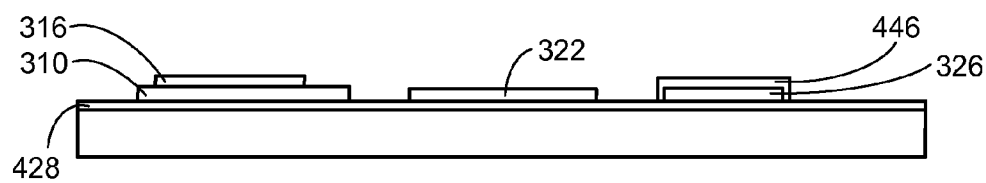
FIG. 13 is the structure of FIG. 9 in a forming phase of the first resistive film, the resistor body, and the third resistive film.

Referring now to FIG. 13, therein is shown the structure of FIG. 12 in a forming phase of the first resistive film 316, the resistor body 322, and the third resistive film 446. A resistive material layer (not shown) is preferably deposited over the first electrode 310, the inductor bridge 326, and the first insulating film 428. The resistive material is preferably patterned, such as mask and etching, forming the first resistive film 316, the resistor body 322, and the third resistive film 446. The third resistive film 446 preferably serves a number of functions. For example, the third resistive film 446 may function as a protection layer for the inductor bridge 326 from further corrosive processing, such as wet etching, and prevents galvanic corrosion of the inductor bridge 326. Galvanic corrosion adversely affects the inductor bridge 326 causing pin holes. The third resistive film 446 is optional.

Figure 14:
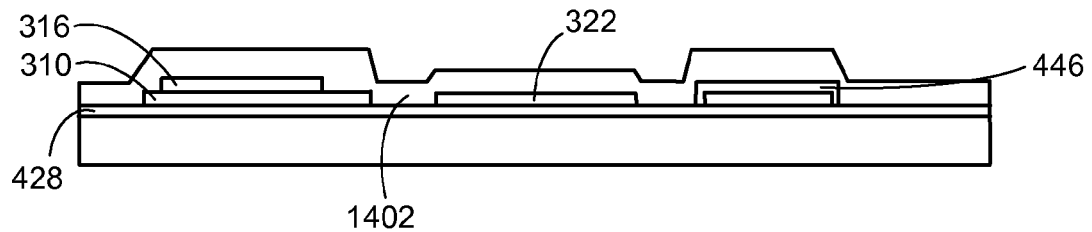
FIG. 14 is the structure of FIG. 13 in an applying phase of a dielectric layer.

Referring now to FIG. 14, therein is shown the structure of FIG. 13 in an applying phase of a dielectric layer 1402. The dielectric layer 1402 is preferably deposited over the entire surface of the substrate 308, of FIG. 3, which includes the first insulating film 428, the first resistive film 316 over the first electrode 310, the resistor body 322, and the third resistive film 446 with the inductor bridge therein. As described earlier, the dielectric layer 1402 may be a single dielectric layer or multiple dielectric layers.

Figure 15:
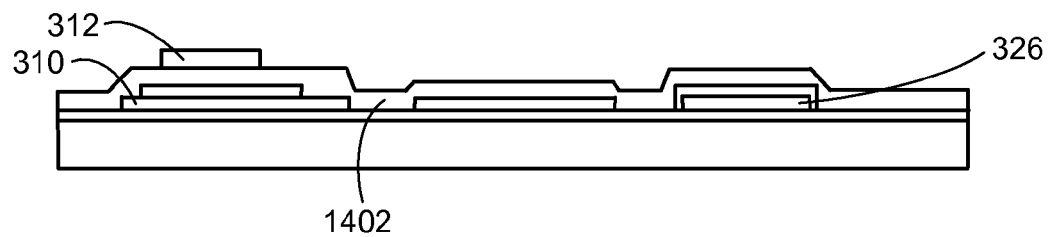
FIG. 15 is the structure of FIG. 14 in a forming phase of the second electrode.

Referring now to FIG. 15, therein is shown the structure of FIG. 14 in a forming phase of the second electrode 312. A conductive layer (not shown) is preferably deposited over the dielectric layer 1402. The deposition of the conductive layer does not require ion milling and does not adversely affect the uniformity of the dielectric layer. The conductive layer is preferably patterned, such as mask and etching, forming the second electrode 312. The dielectric layer 1402 protects the first electrode 310 and the inductor bridge 326 from the forming of the second electrode 312. The dielectric layer 1402 shields the first electrode 310 and the inductor bridge 326 from further corrosive processing, such as wet etching, and prevents galvanic corrosion of the first electrode 310 and the inductor bridge 326. Galvanic corrosion adversely affects the first electrode 310 and the inductor bridge 326 causing pin holes.

Figure 16:
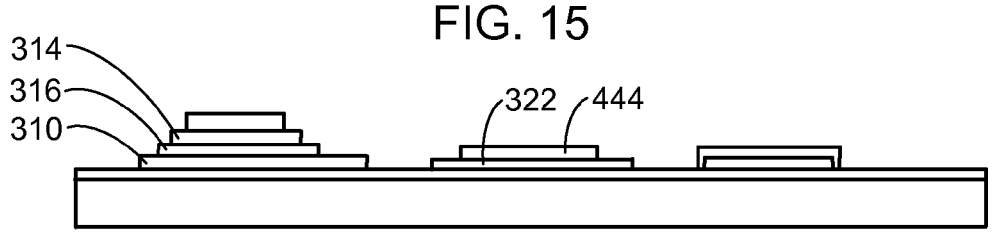
FIG. 16 is the structure of FIG. 15 in a forming phase of the first dielectric structure and the second dielectric structure.

Referring now to FIG. 16, therein is shown the structure of FIG. 15 in a forming phase of the first dielectric structure 314 and the second dielectric structure 444. The dielectric layer 1402 of FIG. 12 is preferably patterned, such as with dry etching, forming the first dielectric structure 314 between first electrode 310 and the second electrode 312, within the horizontal boundary of the first resistive film 316, and does not overlap the first electrode 310. The patterning process also preferably forms the second dielectric structure 444 over the resistor body 322.

It has been discovered that the present invention provides improves the reliability of circuit elements formed over a substrate by eliminating predetermined structural overlaps and by the manufacturing process. The horizontal dimensions of the first dielectric structure and the horizontal dimensions of the first resistive film not extend beyond the horizontal dimensions of the first electrode. As a result, the breakdown voltage between two electrodes of the capacitor through first dielectric structure has been improved.

Figure 17:
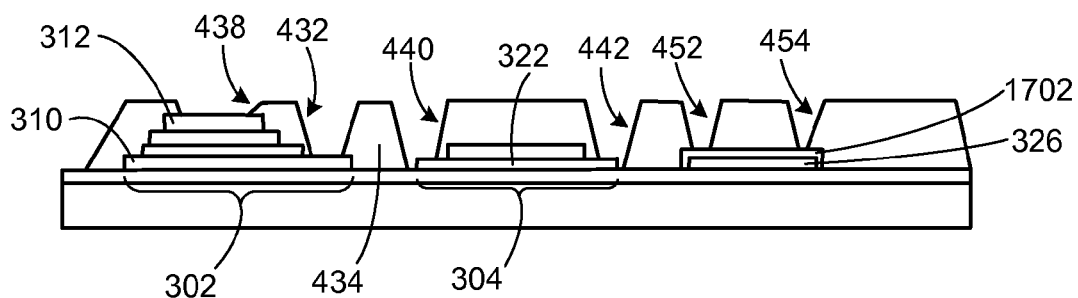
FIG. 17 is the structure of FIG. 16 in a forming phase of the second insulating film.

Referring now to FIG. 17, therein is the structure of FIG. 16 in a forming phase of the second insulating film. A second insulating layer (not shown) is preferably deposited over the structure of FIG. 13. The second insulating layer is preferably patterned, such as mask and etching, forming the second insulating film 434. The second insulating film 434 is shown having the first opening 432 exposing the first electrode 310 and the second opening 438 exposing the second electrode 312. The second insulating film 434 is also shown with the third opening 440 and the fourth opening 442 exposing the ends of the resistor body 322. The second insulating film 434 is further shown with the fifth opening 452 and the sixth opening 454 exposing a third dielectric structure 1702 over the inductor bridge 326. The second insulating film 434 may serve as a protective layer for the first circuit element 302, the second circuit element 304, and the inductor bridge 326.

Figure 18:
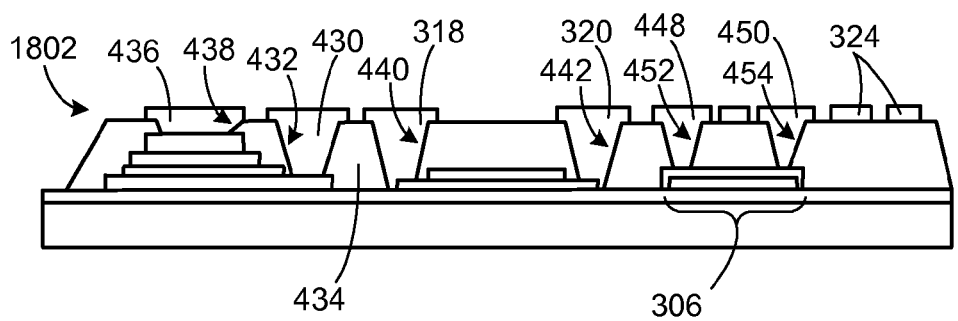
FIG. 18 is the structure of FIG. 17 in a forming phase of interconnects and the inductor body.

Referring now to FIG. 18, therein is shown the structure of FIG. 17 in a forming phase of interconnects 1802 and the inductor body 324. A conductive layer (not shown) is preferably deposited over the structure of FIG. 14. The conductive layer is preferably patterned, such as mask and etching, forming the interconnects 1802. The interconnects 1802 include the first capacitor interconnect 430, the second capacitor interconnect 436, the first resistor interconnect 318, the second resistor interconnect 320, the first inductor interconnect 448, and the second inductor interconnect 450. The interconnects 1802 are preferably form over and in the first opening 432, the second opening 438, the third opening 440, the fourth opening 442, the fifth opening 452, and the sixth opening 454 of the second insulating film 434. The patterning process also preferably forms the inductor body 324 over the second insulating film 434 forming the third circuit element 306.

Figure 19:
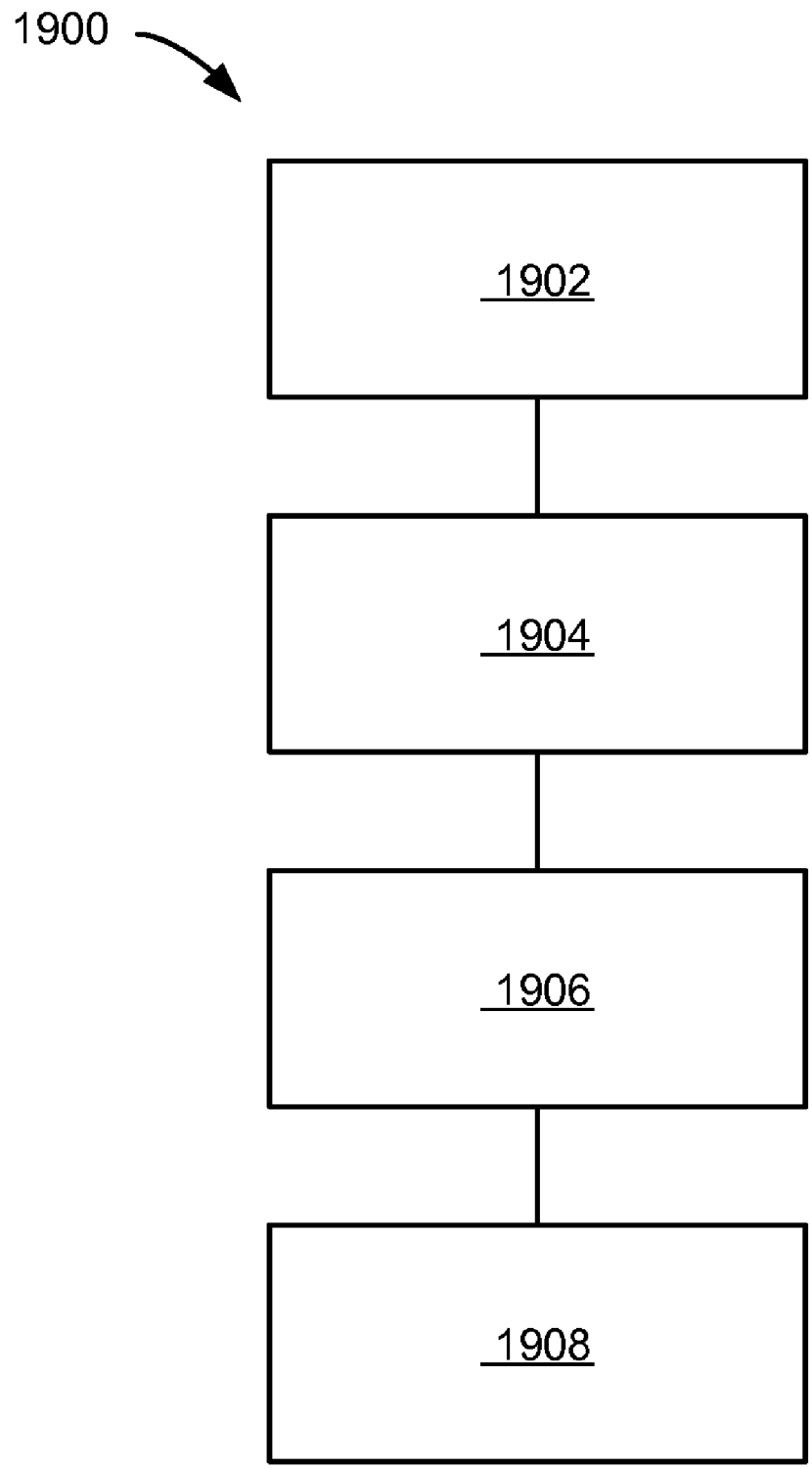
FIG. 19 is a flow chart of a circuit system for manufacturing the circuit system in an embodiment of the present invention.

Referring now to FIG. 19, therein is shown a flow chart of a circuit system 1900 for manufacturing the circuit system 100 in an embodiment of the present invention. The system 1900 includes forming a first electrode over a substrate in a block 1902; applying a dielectric layer over the first electrode and the substrate in a block 1904; forming a second electrode over the dielectric layer in a block 1906; and forming a dielectric structure from the dielectric layer with the dielectric structure within a first horizontal boundary of the first electrode in a block 1908.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the circuit system of the present invention furnishes important and heretofore unknown and unavailable solutions, capabilities, and functional aspects for improving yield, increasing reliability, and reducing cost of circuit system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing a circuit system comprising:
forming a first insulating film directly on a substrate to entirely cover the substrate;
forming a first electrode over the first insulating film;
applying a dielectric layer over the entire surface of the substrate including the first electrode;
forming a second electrode over the dielectric layer; and
patterning a dielectric structure from the dielectric layer, between the first electrode and the second electrode, with the dielectric structure within a first horizontal boundary of the first electrode.

2. The method as claimed in claim 1 further comprising forming a resistive film between the first electrode and the dielectric structure.

3. The method as claimed in claim 1 wherein forming the dielectric structure includes forming the dielectric structure having substantially the same horizontal dimensions of the second electrode.

4. The method as claimed in claim 1 further comprising:
forming an insulating film over the substrate; and
wherein forming the dielectric structure includes:
forming the dielectric structure having substantially the same horizontal dimensions of the insulating film.

5. The method as claimed in claim 1 further comprising:
forming an inductor bridge over the substrate; and
forming a resistive film covering the inductor bridge.

6. A method of manufacturing a circuit system comprising:
forming a first insulating film directly on a substrate to entirely cover the substrate;
forming a first electrode over the first insulating film;
forming a resistive film over the first electrode;
applying a dielectric layer over the entire surface of the substrate including the resistive film, and the first electrode;
forming a second electrode over the dielectric layer; and
patterning a dielectric structure from the dielectric layer, between the first electrode and the second electrode, with the dielectric structure within a first horizontal boundary of the first electrode and within a second horizontal boundary of the resistive film.

7. The method as claimed in claim 6 wherein forming the resistive film includes the resistive film over the substrate and adjacent to the first electrode.

8. The method as claimed in claim 6 further comprising:
forming an insulating film along sides of the second electrode; and
wherein forming the dielectric structure includes:
forming the dielectric structure having substantially the same horizontal dimensions with the insulating film.

9. The method as claimed in claim 6 further comprising:
forming an inductor bridge on the dielectric layer;
forming an inductor body on the dielectric layer; and
forming a further dielectric structure from the dielectric layer under the inductor bridge and the inductor body.

10. The method as claimed in claim 6 wherein forming the first electrode over the substrate includes forming the first electrode over an integrated circuit die, a wafer, or a printed circuit board.

11. A circuit system comprising:
a substrate;
a first insulating film directly on a substrate to entirely cover the substrate;
a first electrode, over the first insulating film, characterized by a lack of galvanic corrosion from a second electrode patterned over the first electrode; and
a dielectric structure between the first electrode and the second electrode with the dielectric structure within a first horizontal boundary of the first electrode.

12. The system as claimed in claim 11 further comprising a resistive film between the first electrode and the dielectric structure with the dielectric structure within a second horizontal boundary of the resistive film.

13. The system as claimed in claim 11 wherein the dielectric structure has substantially the same horizontal dimensions of the second electrode.

14. The system as claimed in claim 11 further comprising:
an insulating film over the substrate; and
wherein the dielectric structure includes has substantially the same horizontal dimensions of the insulating film.

15. The system as claimed in claim 11 further comprising:
an inductor bridge over the substrate; and
a resistive film covering the inductor bridge.

16. The system as claimed in claim 11 wherein:
the first electrode is free of pin holes from galvanic corrosion from processing the second electrode; and
the dielectric structure is within a second horizontal boundary of the resistive film.

17. The system as claimed in claim 16 further comprising a resistive film over the substrate and adjacent to the first electrode.

18. The system as claimed in claim 16 further comprising:
an insulating film along sides of the second electrode; and
wherein the dielectric structure has substantially the same horizontal dimensions with the insulating film.

19. The system as claimed in claim 16 further comprising:
an inductor bridge on a further dielectric structure; and
an inductor body on the further dielectric structure.

20. The system as claimed in claim 16 wherein forming the first electrode over the substrate includes forming the first electrode over an integrated circuit die, a wafer, or a printed circuit board.

* * * * *

UNITED STATES PATENT AND TRADEMARK OFFICE
CERTIFICATE OF CORRECTION

PATENT NO. : 7,863,706 B2
APPLICATION NO. : 11/770690
DATED : January 4, 2011
INVENTOR(S) : Lin Page 1 of 1

It is certified that error appears in the above-identified patent and that said Letters Patent is hereby corrected as shown below:

Column 4:
    Line 63, delete "(Al). Al alloy" and insert therefor -- (Al), Al alloy --

Column 5:
    Line 25, delete "including Al. Al alloy," and insert therefor -- including Al, Al alloy, --
    Line 50, delete "including Al. Al alloy," and insert therefor -- including Al, Al alloy, --

Column 6:
    Line 30, delete "(Al). Al alloy" and insert therefor -- (Al), Al alloy --
    Line 57, delete "including Al. Al alloy," and insert therefor -- including Al, Al alloy, --

Column 7:
    Line 24, delete "(Al). Al alloy" and insert therefor -- (Al), Al alloy --

Signed and Sealed this
Twenty-sixth Day of July, 2011

David J. Kappos
*Director of the United States Patent and Trademark Office*